United States Patent
Wu et al.

(10) Patent No.: US 7,884,394 B2
(45) Date of Patent: Feb. 8, 2011

(54) III-NITRIDE DEVICES AND CIRCUITS

(75) Inventors: Yifeng Wu, Goleta, CA (US);
Rongming Chu, Goleta, CA (US)

(73) Assignee: Transphorm Inc., Goleta, CA (US)

( * ) Notice: Subject to any disclaimer, the term of this patent is extended or adjusted under 35 U.S.C. 154(b) by 187 days.

(21) Appl. No.: 12/368,248

(22) Filed: Feb. 9, 2009

(65) Prior Publication Data
US 2010/0201439 A1 Aug. 12, 2010

(51) Int. Cl.
*H01L 29/66* (2006.01)
(52) U.S. Cl. .............................. 257/194; 257/E29.246
(58) Field of Classification Search .............. 257/194, 257/488, E29.246
See application file for complete search history.

(56) References Cited

U.S. PATENT DOCUMENTS

| 7,304,331 B2 | 12/2007 | Saito et al. |
| 7,501,669 B2 * | 3/2009 | Parikh et al. ............ 257/194 |
| 2006/0102929 A1 | 5/2006 | Okamoto et al. |
| 2007/0018210 A1 | 1/2007 | Sheppard |
| 2008/0283844 A1 | 11/2008 | Hoshi et al. |

OTHER PUBLICATIONS

Chung, Sung Chan, authorized officer, International Search Report and Written Opinion for PCT/US2010/021824 mailed Aug.23, 2010, 9 pages.
Mishra et al., "Enhancement Mode III-N. HEMTs", U.S. Appl. No. 12/108,449, filed Apr. 23, 2008, 58 pp.
Wu et al., "Semiconductor Heterostructure Diodes", U.S. Appl. No. 12/332,284, filed Dec. 10, 2008, 51 pp.
Suh et al., "Enhancement Mode Nitride Power Devices", U.S. Appl. No. 11/856,687, filed Sep. 17, 2007, 58 pp.
Suh et al., "III-Nitride Devices with Recessed Gates", U.S. Appl. No. 12/102,340, filed Apr. 14, 2008, 29 pp.
Suh et al., "Insulated Gate E-Mode Transistors", U.S. Appl. No. 12/324,574, filed Nov. 26, 2008, 43 pp.

* cited by examiner

*Primary Examiner*—Mark Prenty
(74) *Attorney, Agent, or Firm*—Fish & Richardson P.C.

(57) ABSTRACT

A III-nitride based high electron mobility transistor is described that has a gate-connected grounded field plate. The gate-connected grounded field plate device can minimize the Miller capacitance effect. The transistor can be formed as a high voltage depletion mode transistor and can be used in combination with a low voltage enhancement-mode transistor to form an assembly that operates as a single high voltage enhancement mode transistor.

23 Claims, 7 Drawing Sheets

III-NITRIDE DEVICES AND CIRCUITS

TECHNICAL FIELD

This invention relates to semiconductor electronic devices, specifically III-Nitride HEMT devices with field plates, and circuits which they comprise.

BACKGROUND

To date, modern power semiconductor devices, including devices such as power MOSFETs and Insulated Gate Bipolar Transistors (IGBT), have been typically fabricated with silicon (Si) semiconductor materials. More recently, silicon carbide (SiC) power devices have been researched due to their superior properties. III-Nitride (III-N) semiconductor devices are now emerging as an attractive candidate to carry large currents and support high voltages, providing very low on resistance, high voltage device operation, and fast switching times. A typical III-N high electron mobility transistor (HEMT), shown in FIG. 1, comprises a substrate 10, a channel layer 11, such as GaN, atop the substrate, and a barrier layer 12, such as $Al_xGa_{1-x}N$, atop the channel layer. A two-dimensional electron gas (2DEG) channel 19 is induced in the channel layer 11 near the interface between the channel layer 11 and the barrier layer 12. Source and drain electrodes 14 and 15, respectively, form ohmic contacts to the 2DEG Gate electrode 16 modulates the portion of the 2DEG in the gate region, i.e., directly beneath gate electrode 16.

Field plates are commonly used in III-N devices to shape the electric field in the high-field region of the device in such a way that reduces the peak field and increases the device breakdown voltage, thereby allowing for higher voltage operation. Examples of field plated III-N HEMTs are shown in FIGS. 2 and 3. The device in FIG. 2 includes a field plate 18 which is connected to gate electrode 16, i.e., a gate-connected field plate, and an insulator layer 13, such as a layer of SiN, is between the field plate and the barrier layer 12. Field plate 18 can include or be formed of the same material as gate electrode 16. The manufacturing process for a device with a gate-connected field plate is typically relatively simple as compared to that for devices with different field plate configurations, since there is no need to form separate field plate and gate electrode layers, thus the deposition of the gate electrode and field plate can be performed in a single processing step. However, the gate-connected field plate 18 in FIG. 2 increases the capacitance between the gate 16 and drain electrodes 15, thereby reducing the effective operating speed of the device. This increase in capacitance between the input and output of the device, along with the corresponding reduction in high frequency response, is known as the Miller capacitance effect or Miller effect. For applications in which the III-N HEMT shown in FIG. 2 is used, the source electrode 14 is typically grounded, as indicated in the figure.

In the device shown in FIG. 3, the field plate 18 is connected to the source electrode 14, i.e. field plate 18 is a source-connected field plate. Connecting the field plate to the source electrode can reduce or eliminate the Miller effect, since the voltage on the field plate remains fixed when an input signal is applied to the gate electrode. For this configuration, the capacitance between input and output is the source-to-drain capacitance, which typically is small and therefore has a negligible impact on device performance. However, the manufacturing process for this device is more complicated than that for devices with gate-connected field plates, such as the device of FIG. 2.

SUMMARY

In some aspects, a III-N based high electron mobility transistor (HEMT) is described. The transistor has a series of III-N layers, which form a 2DEG channel, a gate electrode on a first side of the series of III-N layers in a gate region, a field plate electrically connected to the gate electrode and separated from the III-N layers by an electrical insulator and a ground connection electrically connected to the field plate and the gate electrode, forming a gate-connected grounded field plate.

The transistors that are described herein can be operated by biasing a source electrode of the transistor and the gate electrode of the transistor, wherein during biasing capacitance between an input and an output of the transistor is minimized in comparison with a similar transistor lacking the gate-connected grounded field plate.

A circuit can include one of the transistors described herein and that is a depletion mode transistor, along with a low voltage enhancement mode transistor, wherein the source of the depletion mode transistor is electrically connected to a drain of the enhancement mode transistor.

An assembly can include one of the circuits that are described herein with a substrate. The substrate includes a conductive layer as the ground connection. The depletion mode transistor and the enhancement mode transistor are attached to the substrate and a source electrode of the enhancement mode transistor is electrically connected to the ground connection.

Other circuits can include a transistor that is described herein along with a diode. The source of the transistor is electrically connected to a cathode of the diode.

Various embodiments of the transistors, circuits and assemblies described herein can include one or more of the following features. The series of III-N layers can include at least three III-N layers, each of the three III-N layers having a different composition. At least one of the layers can be AlN. The 2DEG channel can be a first 2DEG channel, the series of III-N layers can form the first 2DEG channel in a channel III-N layer of the series of III-N layers and a second 2DEG channel can be in the series of III-N layers and parallel to the first 2DEG channel. An insulating layer can be between the gate electrode and the series of III-N layers. A gate recess can be in the series of III-N layers in the gate region and at least a portion of the gate electrode lies within the gate recess. The field plate can have multiple portions that are each a different distance away from the series of III-N layers. The ground connection can be an electrically conductive layer that has a lateral expanse that is greater than a lateral expanse of the transistor. The field plate can be a slant field plate. The transistor can be a depletion mode transistor. A source of the enhancement mode transistor can be grounded. The enhancement mode transistor can be a vertical device and the depletion mode transistor can be a lateral device. An insulating layer can be between the enhancement mode transistor and the substrate, the insulating layer electrically isolating the enhancement mode transistor from the substrate. The enhancement mode transistor can be a vertical device with a gate electrode and the drain electrode on one side of a series of layers of the transistor and a source electrode on an opposite side of the series of layers and the source electrode of the enhancement mode transistor can be mounted directly on the ground connection of the substrate. An assembly can include a source lead, a gate lead and a drain lead on the substrate. The source lead can be electrically connected to the conductive layer of the substrate. The gate lead can be electrically connected to the gate electrode of the enhancement mode transistor and electrically insulated from the conductive layer of the substrate. The drain lead can be electrically connected to the drain electrode of the depletion mode transistor and electrically insulated from the conductive layer of the substrate. The circuit can include a diode, wherein an anode of the diode is electrically connected to the drain of the depletion mode transistor. The diode, the enhancement mode transistor and the depletion mode transistor can be on a common substrate and the diode can include III-N materials. An anode of the diode can be electrically connected to the ground connection. The diode and the transistor are on a common substrate and the diode can comprise a III-N material.

DESCRIPTION OF DRAWINGS

Like reference symbols in the various drawings indicate like elements.

DETAILED DESCRIPTION

Semiconductor devices are described which are simple to manufacture and do not suffer from the Miller capacitance effect. In some embodiments, circuits comprising the devices are described. The manufacturing process for these circuits can be simplified as a result of the inclusion of the devices.

Figure 1:
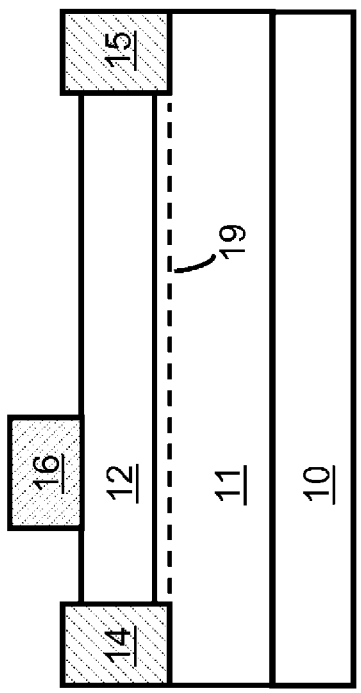
FIGS. 1-3 are schematic cross-sectional views of III-N HEMT devices of the prior art.
Figure 2:
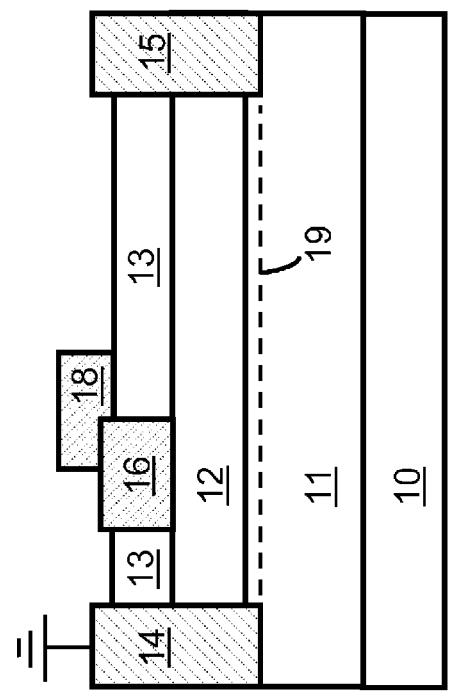
Figure 3:
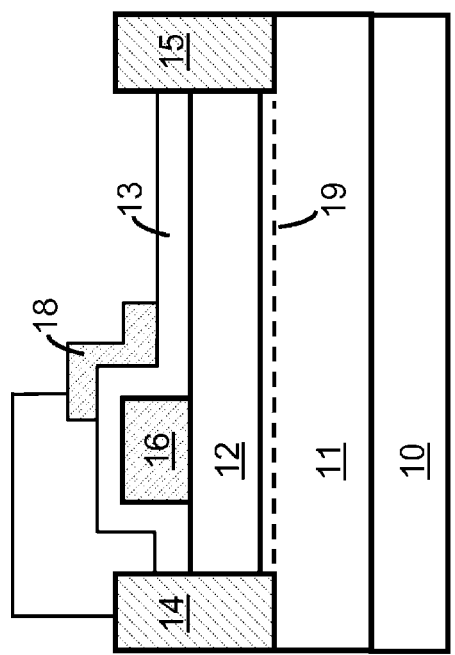
Figure 4:
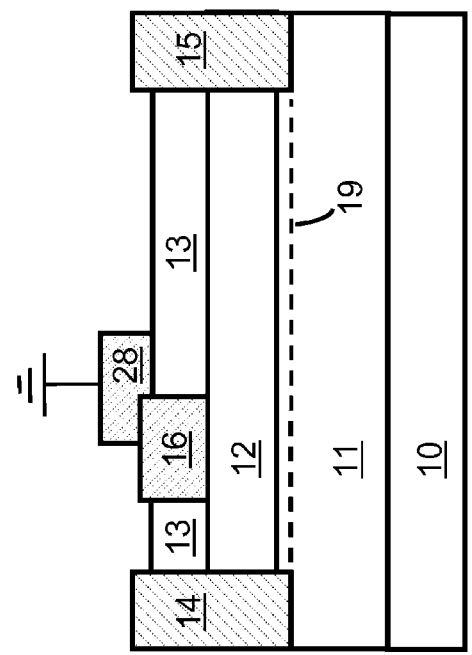
FIGS. 4-8 are schematic cross-sectional views of embodiments of semiconductor transistors with grounded, gate-connected field plates.
Figure 8:
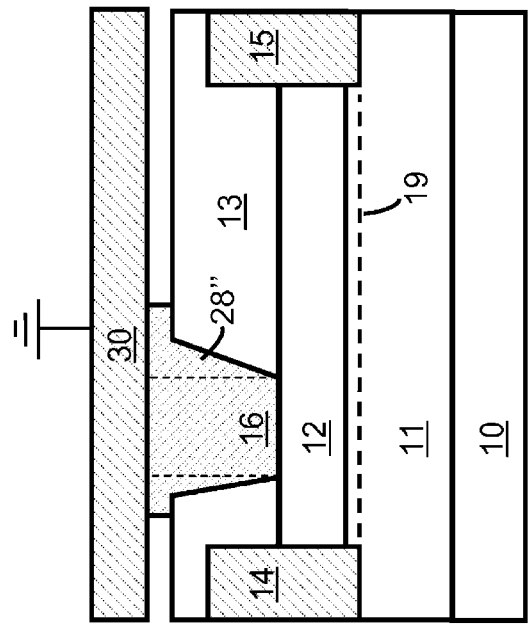

FIG. 4 shows a schematic illustration of a III-Nitride device, i.e., a III-Nitride HEMT, that includes a gate-connected field plate 28, wherein the field plate is electrically connected to ground. This device is herein referred to as having a "grounded gate-connected field plate". As used herein, the terms III-Nitride or III-N materials, layers, devices, etc., refer to a material or device comprised of a compound semiconductor material according to the stoichiometric formula $Al_xIn_yGa_zN$, where x+y+z is about 1. As used herein, two or more contacts or other items are said to be "electrically connected" if they are connected by a material which is sufficiently conducting to ensure that the electric potential at each of the contacts or other items is about the same at all times. As used herein, a "ground terminal" or "ground" is a terminal with a potential (voltage) which the driver voltage signal is referenced relative to. The field plate can be connected to ground in a number of ways. For example, the field plate can be connected to ground directly by attaching one end of a conductive line to the field plate and the other end to ground. Or, the field plate can be directly mounted to a grounded portion of the circuit package, as illustrated in FIG. 8 and described below. Alternatively, the field plate can be connected to a terminal of the circuit package which remains grounded during circuit operation, as illustrated in FIG. 11a and described below. Other grounding schemes are possible as well. In addition to the gate 16 and grounded gate-connected field plate 28, the III-N HEMT shown in FIG. 4 also comprises two III-N layers, a channel layer 11 such as GaN and a barrier layer 12 such as $Al_xGa_{1-x}N$. A 2DEG channel 19 is in the channel layer 11 between the source and drain electrodes 14 and 15 adjacent to the interface between channel layer 11 and barrier layer 12.

Figure 5:
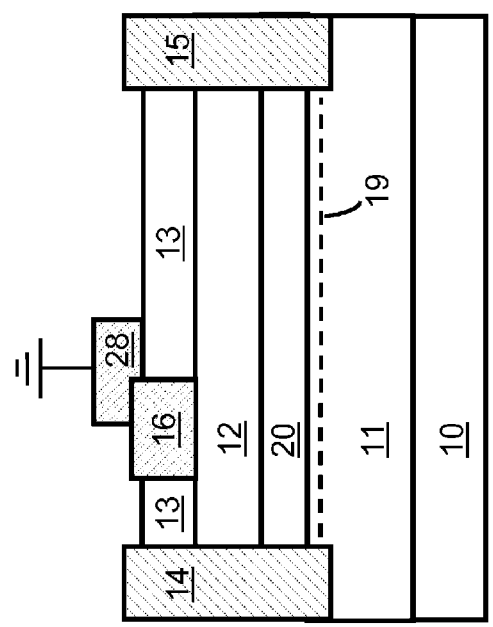
Figure 6:
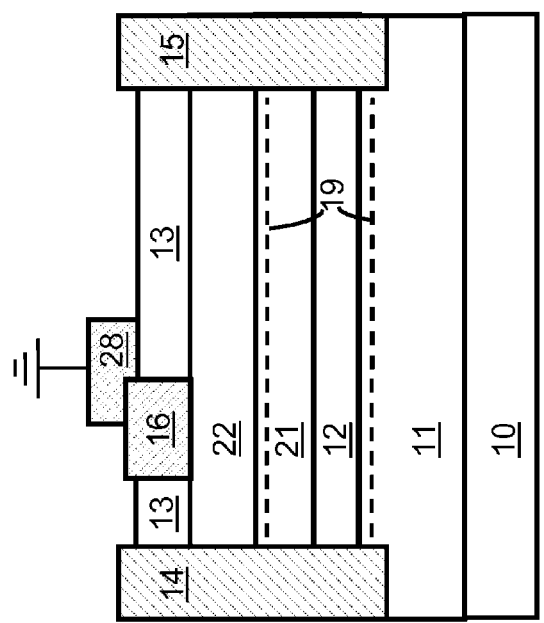

Additionally, the device can include any combination of III-N layers that results in a III-N HEMT structure. For example, the device can include an additional III-N layer 20 such as a layer of AlN between channel layer 11 and barrier layer 12, as shown in FIG. 5. Or, the device can comprise a series of III-N layers that results in two or more parallel 2DEG channels between the source and drain electrodes 14 and 15. An example of a device with two 2DEG channels is shown in FIG. 6. This device includes III-N layers 21 and 22, which may be GaN and $Al_yGa_{1-y}N$, respectively, in addition to the layers shown in the device in FIG. 4. The device in FIG. 6 includes a 2DEG channel 19 in channel layer 11 and another in III-N layer 21. In some embodiments, the device in FIG. 6 can be designed such that there is a 2DEG channel in layer 21 but no 2DEG channel in channel layer 11, such as by including compensating dopants or other impurities, such as Fe or C, in channel layer 11. Or, the device in FIG. 6 can be designed such that the 2DEG in channel layer 11 is substantially less conductive than, and in some cases eliminated with respect to, that in III-N layer 21, such as by including compensating dopants or other impurities, such as Fe or C, in channel layer 11.

Figure 7:
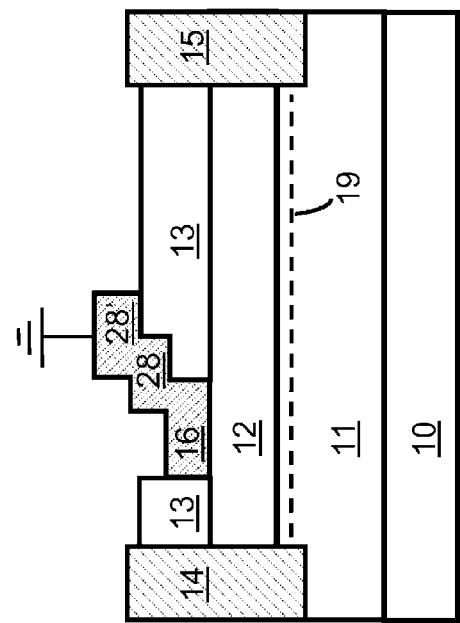

The field plate is comprised of a conducting material and in addition to being grounded, can be in any configuration that reduces the peak electric field in the device and thereby allows the device to operate at higher voltages. For example, in some embodiments the field plate can include a single gate-connected field plate, as shown in FIG. 4. In other embodiments, the field plate can include multiple field plates, which is also referred to as a field plate with multiple portions, as shown in FIG. 7. FIG. 7 illustrates such a device, i.e., with two field plates 28 and 28'. The two field plates 28, 28' are distinguished from one another by their distance from the barrier layer 12, by whether they lie in a recess in an insulating layer or over the insulating layer or by the distance of their exposed upper surface from the insulator layer or a III-N layer of the device. When more than one field plate is used, all of the field plates are electrically connected to each other, at least one of the field plates is electrically connected to the gate, and at least one field plate is electrically connected to ground. FIG. 7 shows the case where only field plate 28' is connected to ground.

In devices with grounded gate-connected field plates, such as those shown in FIGS. 4-8, the voltage on the field plate remains constant. Hence, the input capacitance is unaffected by the field plate, and the field plate does not contribute to the Miller effect in the device. Additionally, the manufacturing of circuits which comprise these devices can be simplified, because the field plate can be directly mounted to a grounded portion of the package. An example of this mounting scheme is shown schematically in FIG. 8, where a slant field plate 28" is directly mounted to grounded portion 30 of the package. A recess in the insulator layer 13 has one or more slanted walls. The gate 16 is shown as the portion that extends from the sides of the recess in the insulator layer 13 where the insulator layer 13 contacts the layer of material of below it that is different from the material of the insulator layer 13, as shown in FIG. 8 barrier layer 12. The gate 16 extends vertically to the grounded portion 30 and the slant field plate 28" extends from the sidewalls of the gate 16 to the sidewalls of the recess. In some embodiments, the slant field plate 28" includes the potion of metal on the side of the gate closest to the drain electrode 15. The grounded portion 30 can be an electrically conductive layer that has a lateral dimension or a plan view surface area that is equal to or greater than a lateral dimension or plan view surface area of the transistor.

In some embodiments, the III-N devices illustrated in FIGS. 4-8 are depletion mode (D-mode) devices, such that the device is in the ON state when the source electrode is at the same voltage as the gate electrode, and the voltage at the gate electrode must be less than that at the source electrode in order for the device to be switched OFF. In some embodiments, the III-N devices illustrated in FIGS. 4-8 can include a recess in the gate region of at least the III-N layer furthest from the substrate, wherein the gate electrode resides within the recess (not shown). In some embodiments, the III-N devices illustrated in FIGS. 4-8 can include an insulating material, i.e., a gate insulator, between the gate electrode and the III-N materials (not shown).

Figure 9:
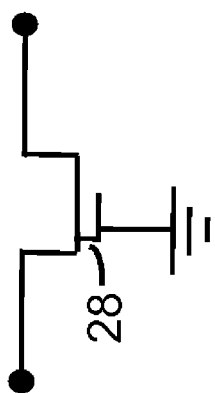
FIG. 9 is a circuit schematic of a semiconductor transistor with a grounded, gate-connected field plate.

Circuits and devices which comprise at least one transistor for which the voltage at the gate electrode remains constant can include transistors configured as shown in FIGS. 4-9. FIG. 9 is a circuit representation of devices of the embodiments shown in FIGS. 4-8, wherein the field plate 28 is connected to the gate and to ground, as shown. The use of these transistors in circuits and devices can simplify the packaging and manufacturing process while at the same time prevent the Miller effect from degrading the performance of the circuits and devices. Embodiments of the circuits and devices that include a grounded gate-connected field plate are shown in FIGS. 10-13.

As used herein, "blocking a voltage" refers to the ability of a transistor to prevent significant current, such as current that is greater than 0.001 times the operating current during regular conduction, from flowing through the transistor when a voltage is applied across the transistor. In other words, while a transistor is blocking a voltage that is applied across it, the total current passing through the transistor will not be greater than 0.001 times the operating current during regular conduction.

Figure 10:
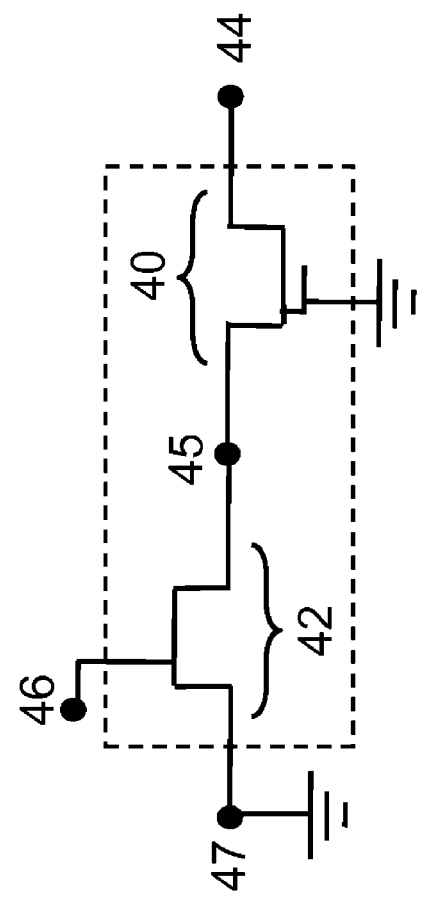
FIG. 10 is a circuit schematic of an assembly comprising two transistors.

The embodiment represented by the circuit diagram of FIG. 10 comprises an assembly including a high-voltage D-mode III-N transistor 40 with a grounded gate-connected field plate and a low voltage enhancement-mode (i.e., normally off) transistor 42, where the source of the III-N transistor 40 is electrically connected to the drain of the enhancement-mode (E-mode) transistor 42, and the source of the E-mode transistor 42 is electrically connected to ground. The assembly in FIG. 10 operates similarly to a single high voltage E-mode transistor. That is, an input voltage signal applied to node 46 can produce an output signal at node 44 that is the same as the output signal produced at the drain terminal of a high voltage E-mode transistor when an input voltage signal is applied to the gate of the E-mode transistor and the source of the E-mode transistor is connected to ground.

In the assembly of FIG. 10, when node 44 is held at a positive voltage, current flows from node 44 to node 47 when a sufficiently positive voltage (i.e., a voltage greater than the threshold voltage of E-mode transistor 42) is applied to node 46, and no substantial current flows when a voltage less than the threshold voltage of E-mode transistor 42, such as 0 V, is applied to node 46. This configuration for a high-voltage E-mode device can be preferable to a single high-voltage E-mode device, because high-voltage E-mode transistors are typically difficult to fabricate.

When a high voltage (HV) is applied to node 44 and node 46 is biased at 0V, E-mode transistor 42 blocks a voltage which is about equal to $|V_{th}|$ or slightly larger, where $|V_{th}|$ is the magnitude of the threshold voltage of III-N transistor 40. A typical value for $V_{th}$ is about −5 to −10 V. The value of HV depends on the particular circuit application, but HV is typically much larger than $|V_{th}|$. For example, HV can be about 600V, about 1200V, or any other voltage suitable for high voltage applications. The voltage at node 45 is therefore about equal to $|V_{th}|$ or slightly larger, so III-N transistor 40 is in the OFF state and blocks a voltage which is equal to about HV minus $|V_{th}|$. When a high voltage (HV) is applied to node 44 and node 46 is biased at a voltage greater than the threshold voltage of E-mode transistor 42 $V_{th,42}$, such as $2*V_{th,42}$, current flows from node 44 to node 47, and the voltage drop $V_F$ across E-mode transistor 42 is much less than $|V_{th}|$, typically less than about 0.2 V. Under these conditions, the voltage at node 45 is $V_F$, and the gate-source voltage $V_{GS40}$ of III-N transistor 40 is about $-V_F$.

The III-N transistor 40 is capable of blocking large voltages, such as at least 600V or at least 1200V or other suitable blocking voltage required by the circuit applications. Furthermore, the threshold voltage $V_{th}$ of III-N transistor 40 must be sufficiently less than $-V_F$ such that when the assembly is in the ON state, the gate-source voltage $V_{GS40}$ of III-N transistor 40 is sufficiently greater than $V_{th}$ so that III-N transistor 40 conducts the current flowing from node 44 to node 47 with sufficiently low conduction loss for the circuit application in which it is used. For example, $V_{th}$ can be less than −3V, −5V, or −7V, and when the gate-source voltage $V_{GS40}$ of III-N transistor 40 is about $-V_F$, III-N transistor 40 can be capable of conducting 10 A of current or more with less than 7 W conduction loss.

E-mode transistor 42 is at least capable of blocking a voltage larger than $|V_{th}|$, where $|V_{th}|$ is the magnitude of the threshold voltage of III-N transistor 40. In some embodiments, E-mode transistor 42 can block about $2*|V_{th}|$. Because the typical threshold voltage for high voltage D-mode III-N transistors is about −5 to −10 V, E-mode transistor 42 can be capable of blocking about 10-20 V or more. In some embodiments, E-mode transistor 42 is a silicon (Si) based transistor, such as a vertical Si field-effect transistor (FET). In other embodiments, E-mode transistor 42 is a III-N based transistor, such as those described in U.S. patent application Ser. No. 11/856,687, filed Sep. 17, 2007, U.S. patent application Ser. No. 12/102,340, filed Apr. 14, 2008, U.S. patent application Ser. No. 12/324,574, filed Nov. 26, 2008, and U.S. patent application Ser. No. 12/108,449, filed Apr. 23, 2008, all of which are hereby incorporated by reference. Additionally, the assembly shown in FIG. 10 can also operate similarly to a single high-voltage E-mode transistor if the source of E-mode transistor 42 and the field plate of III-N transistor 40 are electrically connected to one another, rather than electrically connected to ground (not shown).

FIGS. 11a and 11b show a plan view and a cross-sectional view, respectively, of one possible configuration for the assembly of FIG. 10 after packaging. Only the relevant components of the package are included in the figure. In this configuration, E-mode transistor 42 is a vertical low voltage Si MOS device (FET) and III-N transistor 40 is a horizontal high-voltage D-mode device, wherein III-N transistor 40 includes a grounded, gate-connected field plate 28 which is connected directly to a grounded portion 30 of the package, hereby referred to as the package base 30. In some embodiments, E-mode transistor 42 is a III-N device, such as those described in U.S. patent application Ser. No. 11/856,687, filed Sep. 17, 2007, U.S. patent application Ser. No. 12/102, 340, filed Apr. 14, 2008, U.S. patent application Ser. No. 12/324,574, filed Nov. 26, 2008, and U.S. patent application Ser. No. 12/108,449, filed Apr. 23, 2008. E-mode transistor 42 includes source, gate, and drain electrodes 64, 66, and 60, respectively. E-mode transistor 42 is mounted on a carrier 61, and carrier 61 is mounted on the package base 30. In some embodiments, mounting one structure on another structure includes bonding the structures using epoxy or solder bonds. The carrier 61 at least comprises an electrically conductive layer 91, such as gold (Au), adjacent to drain electrode 60, and an electrically insulating layer 92, such as AlN, adjacent to the package base 30. Insulating layer 92 electrically isolates E-mode transistor 42 from the package base 30. The III-N transistor 40 includes source and drain electrodes 14 and 15, respectively, as well as a gate electrode (not shown) which is connected to field plate 28.

In this embodiment, field plate 28 of the III-N transistor 40 and source electrode 64 of the E-mode transistor 42 are connected, such as by wire bonds or via holes, to the package base 30. The electrically conductive layer of the carrier 61 is connected, such as by wire bonds or copper stripes, to the source electrode 14 of III-N transistor 40, thereby ensuring that drain electrode 60 of E-mode transistor 42 is electrically connected to the source electrode 14 of III-N transistor 40. Gate electrode 66 of the E-mode transistor 42 is connected, such as by wire bonding, to gate lead 76 on the package. Drain electrode 15 of the III-N transistor 40 is connected, such as by wire bonding, to drain lead 74 on the package. The package base 30 is connected, such as by wire bonding or copper stripes, to source lead 77 of the package. Terminal 47 on the source lead 77 of the package can be connected to ground. Alternatively, the entire package base 30 can be bonded to a grounded material rather than connecting it to the source lead 77 of the package. Additionally, the assembly shown in FIGS. 11*a* and 11*b* can also operate similarly to a single high-voltage E-mode transistor if terminal 47 is not connected to ground (not shown).

Figure 11:
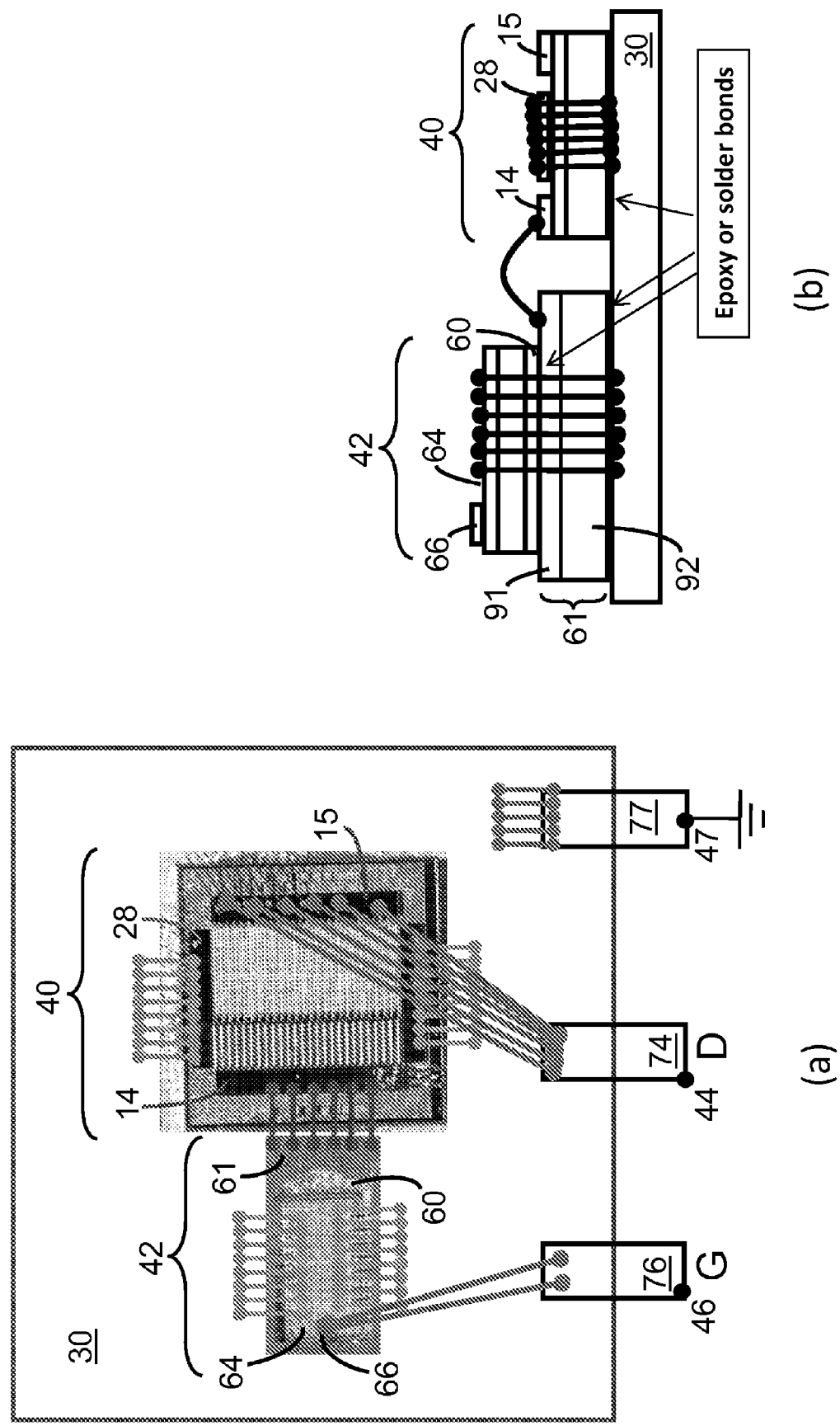
FIGS. 11a and 11b are schematic plan and cross-sectional views, respectively, of one embodiment of the assembly described by FIG. 10.

Other configurations of the packaged assembly in FIG. 11 are possible as well. For example, if E-mode transistor 42 is replaced with a low-voltage E-mode transistor which comprises a gate electrode and a drain electrode on the same side and a source electrode on the opposite side of the III-N layers that form the 2DEG from the gate/drain, then the low-voltage E-mode transistor can be mounted directly on the package base 30 without having an insulator between the low-voltage E-mode transistor and the package base 30. This eliminates the need for carrier 61. This also directly connects the source electrode to the package base 30, i.e., directly connects two conductive portions together.

Figure 12:
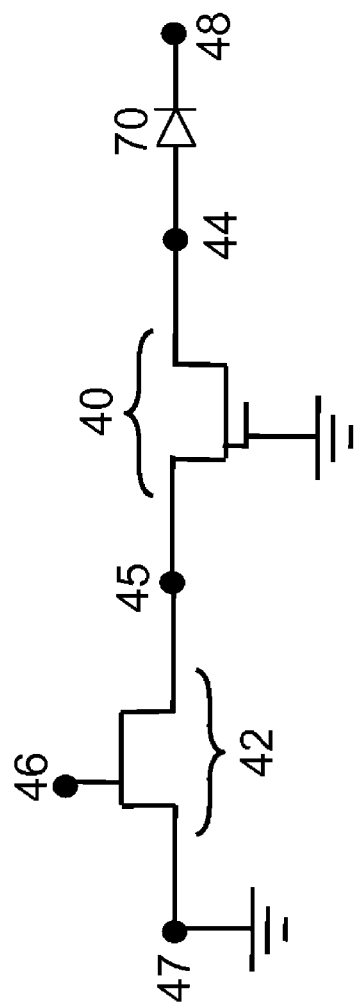
FIG. 12 is a circuit schematic of an assembly comprising two transistors and a diode.

The assembly in FIG. 12 is similar to that in FIG. 10, but further includes a diode 70, where the anode of diode 70 is electrically connected to the drain of III-N transistor 40. This assembly can be used in circuit applications such as power factor correction (PFC). In some embodiments, the diode 70 comprises III-N materials. For example, the diode 70 can be formed of the same III-N materials as III-N transistor 40, and diode 70 and III-N transistor 40 can furthermore be fabricated on the same chip. A complete description of III-N diodes that can be fabricated with the same III-N materials as III-N transistors can be found in U.S. application Ser. No. 12/332, 284, filed Dec. 10, 2008, which is hereby incorporated by reference throughout.

Figure 13:
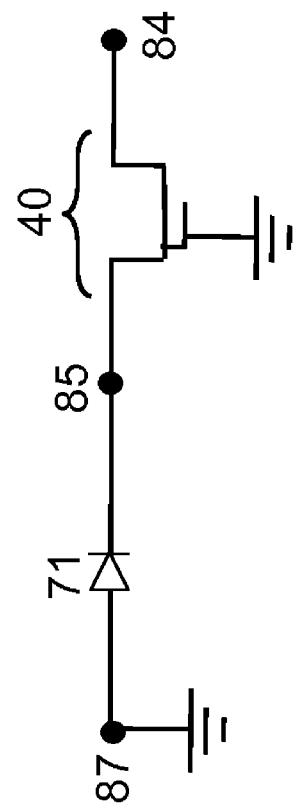
FIG. 13 is a circuit schematic of an assembly comprising a transistor and a diode.

The embodiment shown in FIG. 13 comprises an assembly including a high-voltage D-mode III-N transistor 40 with a grounded gate-connected field plate and a low voltage diode 71. The source of the III-N transistor is electrically connected to the cathode of the diode, and the anode of the diode is electrically connected to ground. The assembly in FIG. 13 operates similarly to a single high-voltage diode. When the voltage at node 84 $V_{84}$ is greater than 0, the diode remains OFF (i.e. reverse biased), and no current flows from node 84 to node 87. While $V_{84}$ is greater than 0 but less than $|V_{th}|$, where $|V_{th}|$ is the magnitude of the threshold voltage of III-N transistor 40, the III-N transistor channel is not pinched off, so all of the voltage is blocked by the diode 71, and the voltage at node 85 $V_{85}$ is about equal to $V_{84}$. Once $V_{84}$ is increased above $|V_{th}|$, the III-N transistor 40 is biased OFF, so the voltage at node 85 remains at about $|V_{th}|$ or slightly higher, and all additional voltage (i.e., $V_{84}-|V_{th}|$) is blocked by the III-N transistor 40. When the diode 71 is forward biased in the ON state, current flows from node 87 to node 84. In order for this to occur, the voltage at node 84 must be less than about $-|V_{on}|$ where $|V_{on}|$ is the turn-on voltage of diode 71. This assembly can be preferable to a single high-voltage diode, because the turn-on voltage of a low-voltage diode is typically lower than that of a high-voltage diode, so the assembly in FIG. 13 can have lower forward conduction loss than a single high-voltage diode.

In some embodiments, the low-voltage diode 71 is a Si-based diode. In other embodiments, the low-voltage diode 71 comprises III-N materials. In still other embodiments, the diode 71 comprises the same III-N materials as III-N transistor 40, and diode 71 and III-N transistor 40 can furthermore be fabricated on the same chip.

The III-N transistor 40 is capable of blocking large voltages, such as at least 600V or at least 1200V or other suitable blocking voltage required by the circuit applications. Furthermore, when the assembly is forward biased such that current flows through the diode 71 and through the III-N transistor 40, the voltage at node 85 is about $-|V_{on}|$. The gate-source voltage $V_{GS40}$ of III-N transistor 40 under these bias conditions is about equal to $|V_{on}|$. The threshold voltage $V_{th}$ of III-N transistor 40 must be sufficiently less than $|V_{on}|$ such that when the assembly is in the ON state, III-N transistor 40 conducts the current flowing from node 87 to node 84 with sufficiently low conduction loss for the circuit application in which it is used. For example, $|V_{on}|$ can be about 0.2 V or less, $V_{th}$ can be less than −3V, −5V, or −7V, and when the gate-source voltage $V_{GS40}$ of III-N transistor 40 is about equal to $|V_{on}|$ III-N transistor 40 is capable of conducting 10 A of current or more with less than 7 W conduction loss. Additionally, the assembly shown in FIG. 13 can also operate similarly to a single high-voltage diode if the anode of low-voltage diode 71 and the field plate of III-N transistor 40 are electrically connected to one another, rather than electrically connected to ground (not shown).

Other features which are well known to be beneficial to device performance can also be included in the structures in FIGS. 4-8. These include but are not limited to gate insulators between the gate electrode and III-N layers, surface passivation layers, and recesses in the gate region of the III-N materials. These features can be used individually or in combination with one another.

What is claimed is:
1. A III-N based high electron mobility transistor (HEMT), comprising:
 a series of III-N layers, which form a 2DEG channel;
 a gate electrode on a first side of the series of III-N layers in a gate region;
 a field plate electrically connected to the gate electrode and separated from the III-N layers by an electrical insulator; and a ground connection electrically connected to the field plate and the gate electrode, forming a gate-connected grounded field plate.

2. The transistor of claim 1, wherein the series of III-N layers includes at least three III-N layers, each of the three III-N layers having a different composition.

3. The transistor of claim 2, where at least one of the layers is AlN.

4. The transistor of claim 2, wherein the 2DEG channel is a first 2DEG channel, the series of III-N layers forms the first 2DEG channel in a channel III-N layer of the series of III-N layers and a second 2DEG channel is in the series of III-N layers and is parallel to the first 2DEG channel.

5. The transistor of claim 1, further comprising a gate insulating layer on the first side of the series of III-N layers and between the gate electrode and the series of III-N layers.

6. The transistor of claim 1, wherein the a gate recess is included in the series of III-N layers in the gate region and at least a portion of the gate electrode lies within the gate recess.

7. The transistor of claim 1, wherein the field plate has multiple portions that are each a different distance away from the series of III-N layers.

8. The transistor of claim 1, wherein the ground connection is an electrically conductive layer that has a lateral expanse that is greater than a lateral expanse of the transistor.

9. The transistor of claim 1, wherein the field plate is a slant field plate.

10. The transistor of claim 1, wherein the transistor is a depletion mode transistor.

11. Operating the transistor of claim 1, comprising biasing a source electrode of the transistor and the gate electrode of the transistor of claim 1, wherein during biasing capacitance between an input and an output of the transistor is minimized in comparison with a similar transistor lacking the gate-connected grounded field plate.

12. A circuit, comprising:
the transistor of claim 1, wherein the transistor is a depletion mode transistor; and
a low voltage enhancement mode transistor, wherein the source of the depletion mode transistor is electrically connected to a drain of the enhancement mode transistor.

13. The circuit of claim 12, wherein a source of the enhancement mode transistor is grounded.

14. An assembly, comprising,
the circuit of claim 12; and
a substrate, wherein the substrate includes a conductive layer as the ground connection, the depletion mode transistor and the enhancement mode transistor are attached to the substrate, and a source electrode of the enhancement mode transistor is electrically connected to the ground connection.

15. The assembly of claim 14, wherein:
the enhancement mode transistor is a vertical device; and
the depletion mode transistor is a lateral device.

16. The assembly of claim 15, wherein an insulating layer is between the enhancement mode transistor and the substrate, the insulating layer electrically isolating the enhancement mode transistor from the substrate.

17. The assembly of claim 14, wherein:
the enhancement mode transistor is a vertical device with a gate electrode and the drain electrode on one side of a series of layers of the transistor and a source electrode on an opposite side of the series of layers and the source electrode of the enhancement mode transistor is mounted directly on the ground connection of the substrate.

18. The assembly of claim 14, further comprising a source lead, a gate lead and a drain lead on the substrate, wherein:
the source lead is electrically connected to the conductive layer of the substrate;
the gate lead is electrically connected to the gate electrode of the enhancement mode transistor and electrically insulated from the conductive layer of the substrate; and
the drain lead is electrically connected to the drain electrode of the depletion mode transistor and electrically insulated from the conductive layer of the substrate.

19. The circuit of claim 12, further comprising a diode, wherein an anode of the diode is electrically connected to the drain of the depletion mode transistor.

20. An assembly, comprising the circuit of claim 19, wherein the diode, the enhancement mode transistor and the depletion mode transistor are on a common substrate and the diode comprises III-N materials.

21. A circuit, comprising:
the transistor of claim 1; and
a diode, wherein a source of the transistor is electrically connected to a cathode of the diode.

22. The circuit of claim 21, wherein an anode of the diode is electrically connected to the ground connection.

23. An assembly, comprising the circuit of claim 21, wherein the diode and the transistor are on a common substrate and the diode comprises a III-N material.

* * * * *